(12) United States Patent
Wodnicki

(10) Patent No.: US 6,856,175 B2
(45) Date of Patent: Feb. 15, 2005

(54) ULTRASOUND TRANSMITTER WITH VOLTAGE-CONTROLLED RISE/FALL TIME VARIATION

(75) Inventor: Robert G. Wodnicki, Niskayuna, NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 10/317,872

(22) Filed: Dec. 12, 2002

(65) Prior Publication Data

US 2004/0113669 A1 Jun. 17, 2004

(51) Int. Cl.[7] .................................................. H03K 3/00
(52) U.S. Cl. ........................ 327/108; 327/112; 327/170
(58) Field of Search .......................... 327/108–112, 170, 327/434–437; 326/81, 82

(56) References Cited

U.S. PATENT DOCUMENTS

| | | | |
|---|---|---|---|
| 5,198,747 A | * | 3/1993 | Haight ........................ 323/303 |
| 5,603,324 A | | 2/1997 | Oppelt et al. |
| 5,942,922 A | * | 8/1999 | Dinteman et al. .......... 327/108 |
| 6,007,755 A | | 12/1999 | Hoshii et al. |
| 6,278,305 B1 | * | 8/2001 | Tanaka ....................... 327/170 |
| 6,380,766 B2 | | 4/2002 | Savord |
| 6,501,313 B2 | * | 12/2002 | Boerstler et al. ........... 327/175 |

* cited by examiner

*Primary Examiner*—Kenneth B. Wells
(74) *Attorney, Agent, or Firm*—Ostrager Chong Flaherty & Broitman P.C.

(57) ABSTRACT

In an ultrasound transmit ASIC, the rise and fall times of the output pulse can be controlled by varying the gate-source voltage used to drive the output-stage transistors. Control of the rise/fall times can be effected either by trimming on-chip during fabrication or by changing the gate-source voltage that drives the output-stage transistors, either on-chip or off-chip. In all cases it will be necessary to first test the manufactured device to determine how much calibration voltage needs to be applied.

15 Claims, 9 Drawing Sheets

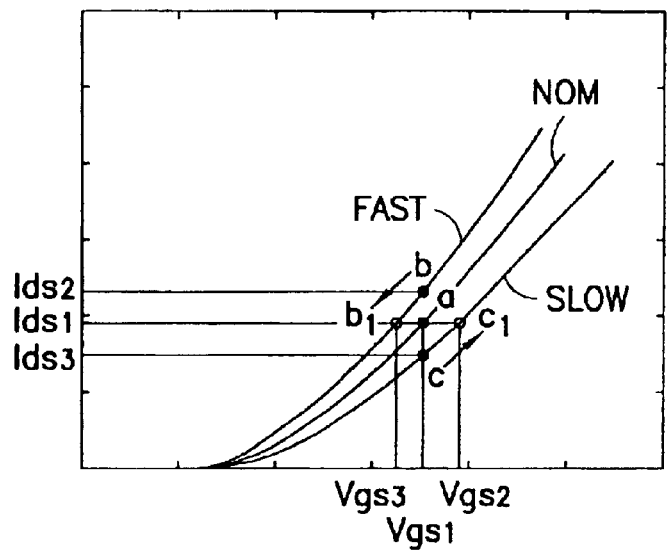
FIG.3
PRIOR ART
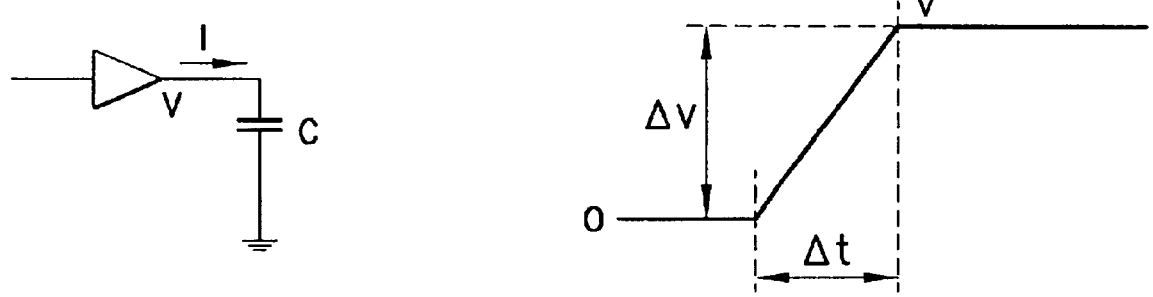
FIG.4
PRIOR ART
FIG.5
PRIOR ART

ULTRASOUND TRANSMITTER WITH VOLTAGE-CONTROLLED RISE/FALL TIME VARIATION

BACKGROUND OF THE INVENTION

This invention generally relates to integrated circuitry for use in conjunction with ultrasound transducer elements. In particular, the invention relates to ultrasound transmit application-specific integrated circuits (ASICs) for use in ultrasound imaging systems.

A medical ultrasound imaging system forms an image by acquiring individual ultrasound lines (or beams). The lines are adjacent to each other and cover the target area to be imaged. Each line is formed by transmitting an ultrasonic pulse in a particular spatial direction and receiving the reflected echoes from that direction. The spatial characteristics of the transmitted wave and the characteristics of the receive sensitivity determine the quality of the ultrasound image. It is desirable that the ultrasound line gathers target information only from the intended direction and ignores targets at other directions.

Conventional ultrasound imaging systems comprise an array of ultrasonic transducer elements that are used to transmit an ultrasound beam and then receive the reflected beam from the object being studied. Such scanning comprises a series of measurements in which the focused ultrasonic wave is transmitted, the system switches to receive mode after a short time interval, and the reflected ultrasonic wave is received, beamformed and processed for display. Typically, transmission and reception are focused in the same direction during each measurement to acquire data from a series of points along an acoustic beam or scan line. The receiver is dynamically focused at a succession of ranges along the scan line as the reflected ultrasonic waves are received.

For ultrasound imaging, the array typically has a multiplicity of transducer elements arranged in one or more rows and driven with separate voltages. By selecting the time delay (or phase) and amplitude of the applied voltages, the individual transducer elements in a given row can be controlled to produce ultrasonic waves that combine to form a net ultrasonic wave that travels along a preferred vector direction and is focused in a selected zone along the beam.

The same principles apply when the transducer probe is employed to receive the reflected sound in a receive mode. The voltages produced at the receiving transducer elements are summed so that the net signal is indicative of the ultrasound reflected from a single focal zone in the object. As with the transmission mode, this focused reception of the ultrasonic energy is achieved by imparting separate time delay (and/or phase shifts) and gains to the signal from each receiving transducer element. The time delays are adjusted with increasing depth of the returned signal to provide dynamic focusing on receive.

The quality or resolution of the image formed is partly a function of the number of transducer elements that respectively constitute the transmit and receive apertures of the transducer array. Accordingly, to achieve high image quality, a large number of transducer elements is desirable for both two- and three-dimensional imaging applications. The ultrasound transducer elements are typically located in a hand-held transducer probe that is connected by a flexible cable to an electronics unit that processes the transducer signals and generates ultrasound images. The transducer probe may carry both ultrasound transmit circuitry and ultrasound receive circuitry.

It is known to include high-voltage components in the transmit circuitry to drive the individual ultrasound transducer elements, while low-voltage, high-density digital logic circuitry is used to provide transmit signals to the high-voltage drivers. The high-voltage drivers typically operate at voltages of up to approximately 100 volts, while the low-voltage logic circuitry has an operating voltage on the order of 5 volts in the case of TTL logic. The high-voltage drivers may be fabricated as discrete components or as integrated circuits, while the low-voltage logic circuitry may be fabricated as a separate integrated circuit or combined with the high-voltage circuitry on a single chip. In addition to transmit circuitry including the high-voltage drivers and low-voltage logic circuitry, the transducer head may include low-noise, low-voltage analog receive circuitry. The low-voltage receive circuitry, like the transmit logic circuitry, typically has an operating voltage on the order of 5 volts, and may be a separate integrated circuit or may be fabricated with the low-voltage transmit logic circuitry as a monolithic integrated circuit.

In order to maximize the number of transducer elements to achieve high-quality ultrasound images, it is desirable to integrate as much circuitry as possible in as small a volume as possible to reduce the size and complexity of the circuitry, whether the circuitry be located within a transducer probe or in an electronics unit separate therefrom. In addition, some applications, for example, very high-frequency ultrasound imaging, require that transmit circuitry be located as close as possible to the transducer elements to avoid signal loading by a long cable. Therefore it has been proposed to integrate the aforementioned high-voltage drivers with either or both of the low-voltage transmit logic circuitry and the low-voltage receive circuitry as a monolithic integrated circuit.

In typical high-voltage integrated circuit processes, variation of the transistor drain-source current with processing can be as much as 1:2. This leads to significant variation in the rise time of a high-voltage ultrasound transmitter stage. This variation can yield distortions in the ultrasound image. The standard way to mitigate this phenomenon is to design transistors that are twice as large as normal (twice the drain-source current), and trim off until the desired drain-source current is attained. This leads to increased cost due to the need for trimming and larger die area.

In ultrasound imaging, especially when used for echocardiography, second harmonic distortion leads to a decrease in sensitivity of the system. Such distortion can be quantified by taking the Fourier spectrum of the transmitted signal and measuring the magnitude of the peak that is the second harmonic above the fundamental or transmit frequency.

Lack of symmetry between rise and fall times of the pulse edges is one source of second harmonic distortion. This effect can be mitigated by carefully matching the transistors used in the output stage of the transmitter. Such matching is typically done either through trimming or by sorting of discrete devices in standard manufacturing practice. When using a monolithic transmitter however, sorting of devices becomes more costly.

There is a need for improved methods and devices for controlling the rise and fall times of the output pulse in an ultrasound transmitter integrated circuit.

BRIEF DESCRIPTION OF THE INVENTION

In an ultrasound transmit ASIC, the rise and fall times of the output pulse can be controlled by varying the gate-source voltage used to drive the output-stage transistors. The present invention effects control of the rise/fall times either by trimming on-chip during fabrication or by changing the gate-source voltage that drives the output-stage transistors, either on-chip or off-chip. In all cases it will be necessary to first test the manufactured device to determine how much calibration voltage needs to be applied: This testing may only need to be done once, but could also be done in operation for fine tuning as necessary.

The invention provides the following advantages: (1) reducing anomalous variation in rise and fall times without requiring significant increased ASIC die area, which would ordinarily reduce system integration levels and make the device more costly; and (2) direct control of harmonic distortion in the output pulse through precise adjustment of pulse width.

One aspect of the invention is a device comprising: an ultrasound transducer element and an integrated circuit that comprises: means for driving the ultrasound transducer element with a transmit pulse having a rise time and a fall time; and means for varying the rise or fall time of the transmit pulse.

Another aspect of the invention is a method of driving an ultrasound transducer element in selectable first and second modes, comprising the following steps: coupling the ultrasound transducer element to an MOS transistor; in the first mode, turning on the MOS transistor using a first gate-source voltage to produce a first transmit pulse having a first rise (or fall) time; and in a second mode, turning on the MOS transistor using a second gate-source voltage different than the first gate-source voltage to produce a second transmit pulse having a second rise (or fall) time different than the first rise (or fall) time.

A further aspect of the invention is a device comprising: an ultrasound transducer element; a PMOS transistor and a NMOS transistor having their drains connected at a junction, the source of the PMOS transducer being connected to a first terminal at a first voltage level and the source of the NMOS transistor being connected to a second terminal at a second voltage level lower than the first voltage level, the junction being electrically coupled to an input of the ultrasound transducer element; a first resistance disposed between the gate of the PMOS transistor and a (+) terminal of a first control signal voltage; a second resistance disposed between the gate of the NMOS transistor and a (+) terminal of a second control signal voltage; a third resistance disposed between a junction lying between the first resistance and the PMOS transistor and a third terminal at the first voltage level; and a fourth resistance disposed between a junction lying between the third resistance and the NMOS transistor and a fourth terminal at the second voltage level.

Yet another aspect of the invention is a method of manufacturing the device described in the preceding paragraph, comprising the following steps: calibrating the rise (or fall) time of a transmit pulse output from the junction of the drains of the PMOS and NMOS transistors to the ultrasound transducer element; and trimming the third resistance so that the gate-source voltage of the PMOS transistor will produce a desired rise (or fall) time of the transmit pulse.

A further aspect of the invention is a device comprising: an ultrasound transducer element; a PMOS transistor and a NMOS transistor having their drains connected at a junction, the source of the PMOS transducer being connected to a first terminal at a first voltage level and the source of the NMOS transistor being connected to a second terminal at a second voltage level lower than the first voltage level, the junction being electrically coupled to an input of the ultrasound transducer element; a first logic driver for outputting a first logic voltage; a second logic driver for outputting a second logic voltage; a first level shifter having an output connected to a gate of the PMOS transistor and an input coupled to the first logic driver; and a second level shifter having an output connected to a gate of the NMOS transistor and an input coupled to the second logic driver.

Yet another aspect of the invention is a method for adjusting the duty cycle of an ultrasound transmit pulse output by an integrated circuit to an ultrasound transducer element, comprising the following steps: calibrating the rise (or fall) times of ultrasound transmit pulses output by the integrated circuit as a function of a variable logic voltage; and driving the integrated circuit with a logic voltage that produces a transmit pulse having a desired rise (or fall) time.

Another aspect of the invention is a device comprising: an ultrasound transducer element; a first PMOS transistor and a first NMOS transistor having their drains connected at a junction, the source of the first PMOS transistor being connected to a terminal at a first voltage level and the source of the first NMOS transistor being connected to a second terminal at a second voltage level lower than the first voltage level, the junction being electrically coupled to an input of the ultrasound transducer element; a second NMOS transistor having a drain connected to the gate of the first PMOS transistor and having a source connected to a terminal at a control voltage level; and a digital-to-analog converter that supplies the control voltage level.

Although the circuits disclosed hereinafter use a PMOS and NMOS device, this invention will also work with the following circuits: (i) a single PMOS device with a pull-down resistor; (ii) a single NMOS device with a pull-up resistor; (iii) a NMOS/PMOS circuit with additional "clamp" transistors. In a bipolar transmitter, the output voltage swings between positive and negative voltages (e.g., +80 V→−80 V) and then returns to 0 V. The return to 0 V is typically accomplished using a third NMOS transistor or PMOS transistor (or both) that pulls the output voltage back to 0 V. To control the harmonic distortion, it is advantageous to also control the rise (or fall) time of the pulse edge as it returns to 0 V, pulled by this "clamp" transistor. The invention could readily be used for this purpose. Further, different types of transistors (e.g., bipolar junction transistors) could also be used with this invention, although the circuitry would have to be modified.

Other aspects of the invention are disclosed and claimed below.

BRIEF DESCRIPTION OF THE DRAWINGS

FIG. 3 is a graph of MOSFET drain-source current change due to semiconductor process variations.

FIG. 4 is a schematic of an ideal capacitive load.

FIG. 5 is a schematic of rise time determination for the ideal capacitive load depicted in FIG. 4.

DETAILED DESCRIPTION OF THE INVENTION

Figure 1:
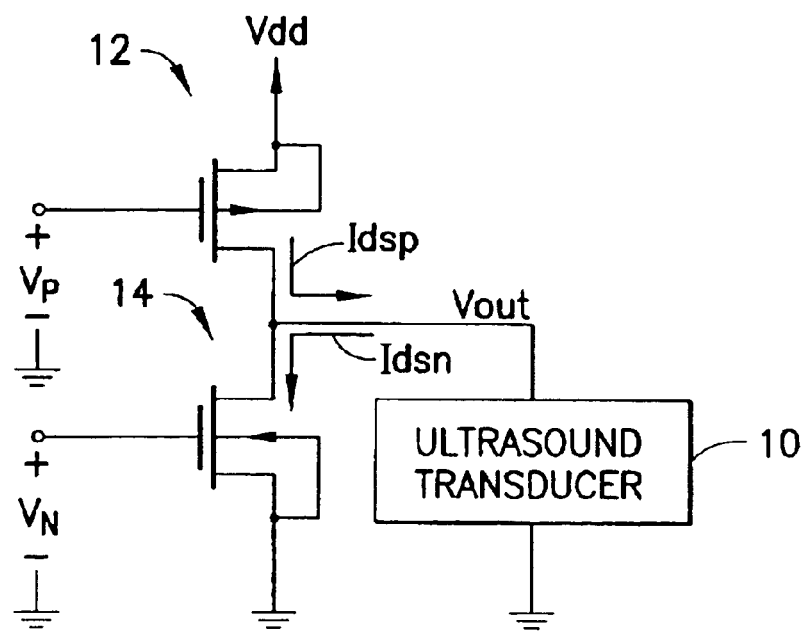
FIG. 1 is a schematic of a conventional ultrasound transmitter configuration.

At the outset it should be noted that the connections to ground shown in the drawings are simplifications. In each of the embodiments disclosed herein, the ground terminal is likely to be connected to a negative voltage which is often called $V_{ss}$. While it is simplest to show this as ground and in some cases (called "unipolar" transmitters) this is in fact the case, the majority of ultrasound machines today use "bipolar" transmitters. In a bipolar transmitter, the source of the NMOS device is connected to a voltage that is usually the negative opposite of the source of the PMOS. So for example, we might have $V_{dd}$=+80 V and $V_{ss}$=−80 V.

The high-voltage ultrasound transmitter circuit consists of a high-voltage high-current output stage that is controlled by a low-current intermediate stage. The intermediate stage typically drives the gates of the output transistors 5 to 10 V greater (NMOS) or less than (PMOS) the high-voltage supply. The rise time is directly related to the drain-source current when driving the ultrasound transducer, which is principally a capacitive load. This is because the drain-source current sets the maximum drive current that is used to drive the transducer capacitance directly. The drain-source current in turn is a function of the gate-source voltage (as well as other parameters not used here). Therefore, the drain-source current can be controlled by changing the gate-source voltage that is used by the intermediate drive stage to turn on the transistors in the output stage. For example, if the rise time is found to be too long in a particular device, it can be reduced by increasing the gate-source voltage that is driven by the intermediate stage to turn on the output transistor.

The present invention can be applied either during manufacture of the device through resistor trimming or during use of the device by trimming a supply voltage. Additionally, an on-chip DAC could be used in a similar fashion to adjust the desired rise/fall times. In all cases it will be necessary to first test the manufactured device to determine how much calibration voltage needs to be applied: This testing may only need to be done once.

Figure 2:
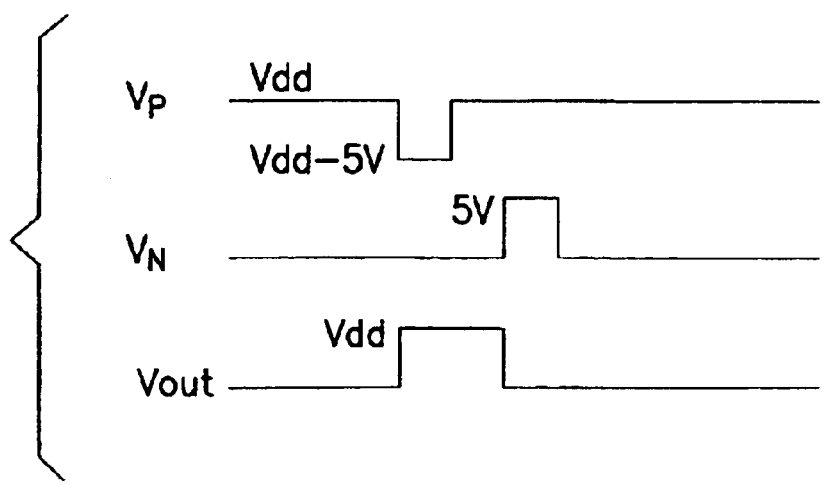
FIG. 2 is a graph showing the output voltage $V_{out}$ to the ultrasound transducer element and the corresponding input voltages $V_P$ and $V_N$ respectively supplied to the gates of a pair of output-stage transistors for the circuit depicted in FIG. 1.

FIG. 1 is a schematic depicting a standard ultrasound transmitter configuration for one ultrasound transducer element. Each element in an ultrasound transducer array can be driven by a respective ultrasound transmitter having the configuration shown in FIG. 1. The ultrasound transducer element 10 is driven by the voltage $V_{out}$ output from a junction connecting the drain of a PMOS transistor 12 to the drain of an NMOS transistor 14. The source of PMOS transistor 12 is connected to a terminal at potential $V_{dd}$, while the source of NMOS transistor 14 is connected to ground. The gate of PMOS transistor 12 has a control signal voltage $V_P$ applied thereto, while the gate of NMOS transistor 14 has a control signal voltage $V_N$ applied thereto. For the sake of illustration, FIG. 2 depicts the input and output voltages for the case wherein the gates of the output transistors 12 and 14 are respectively driven 5 V less than the high-voltage supply $V_{dd}$ and 5 V greater than ground. When the control voltage $V_P$ input to the gate of transistor 12 falls by 5 V, then the transistor 12 is turned on and $V_{out}$ to the ultrasound transducer element rises from 0 to $V_{dd}$. Later when the control voltage $V_N$ input to the gate of transistor 14 rises to 5 V, the transistor 14 is turned on and the voltage level $V_{out}$ to the ultrasound transducer element falls from $V_{dd}$ to 0. The drain-source current $I_{dsp}$ for the PMOS transistor (indicated by an arrow in FIG. 1) flows out of the PMOS drain into the transducer. The drain-source current $I_{dsn}$ for the NMOS transistor flows from the transducer back into the NMOS drain. Thus the current flowing into the ultrasound transducer element 10 comes from the MOSFETs and can be individually controlled on the rising and falling edges of the output pulse.

FIG. 3 shows a graph illustrating how MOSFET drain-source current $I_{ds}$ is affected by semiconductor process variation. The graph plots three curves of $I_{ds}$ with respect to gate-source voltage ($V_{gs}$): "Slow" corresponds to devices that come from a lot in which $I_{ds}$ is less than the nominal expected value; "Fast" corresponds to devices that come from a lot in which $I_{ds}$ is greater than the nominal expected value; and "Nom" corresponds to devices where $I_{ds}$ is the nominal value.

In the nominal case, as can be seen on the graph, a gate-source voltage $V_{gs1}$ will produce a drain-source current $I_{ds1}$ (node "a"). Typically, a circuit will be designed to provide voltage $V_{gs1}$ at the MOSFET gate regardless of process variation. In this case, in a slow lot, the desired $I_{ds1}$ value would instead translate to $I_{ds3}$ as shown (node "c"). Similarly, a fast lot would show a value of $I_{ds2}$ (node "b") when $V_{gs1}$ is applied to the MOSFET gate.

Taking these curves, it can be seen that $I_{ds}$ can be "tuned" by adjusting the gate-source voltage until the desired $I_{ds}$ value is obtained. For example, as shown in FIG. 3, a slow lot can be tuned back to $I_{ds1}$ (node "$c_1$") from $I_{ds3}$ (node "c") by increasing $V_{gs1}$ up to $V_{gs2}$. Similarly, a fast lot can be tuned back to $I_{ds1}$ (node "$b_1$") from $I_{ds2}$ (node "b") by adjusting $V_{gs1}$ back to $V_{gs3}$.

In this way, it is possible to tune out the effects of process variations either during manufacture or during device operation provided that the desired operating point is known, and the actual operating point can be measured.

FIG. 4 is a schematic showing an ideal capacitance C being charged with an ideal constant current I to the voltage V with respect to ground. This capacitance models the bulk transducer capacitance, which accounts for the majority of the load seen by the transducer driver. The current and voltage of the capacitance are related by the following differential equation:

$$I = C\frac{\partial V}{\partial t}$$

This equation can be approximated as follows:

$$I = C\frac{\Delta V}{\Delta t}$$

Rearranging terms shows that:

$$\Delta t = C\frac{\Delta V}{I}$$

This means that for a given required rise time Δt, the current I needed to charge the capacitance to a required voltage ΔV is readily determined. Provided that the current can be controlled directly, the rise time can be controlled also.

Figure 6:
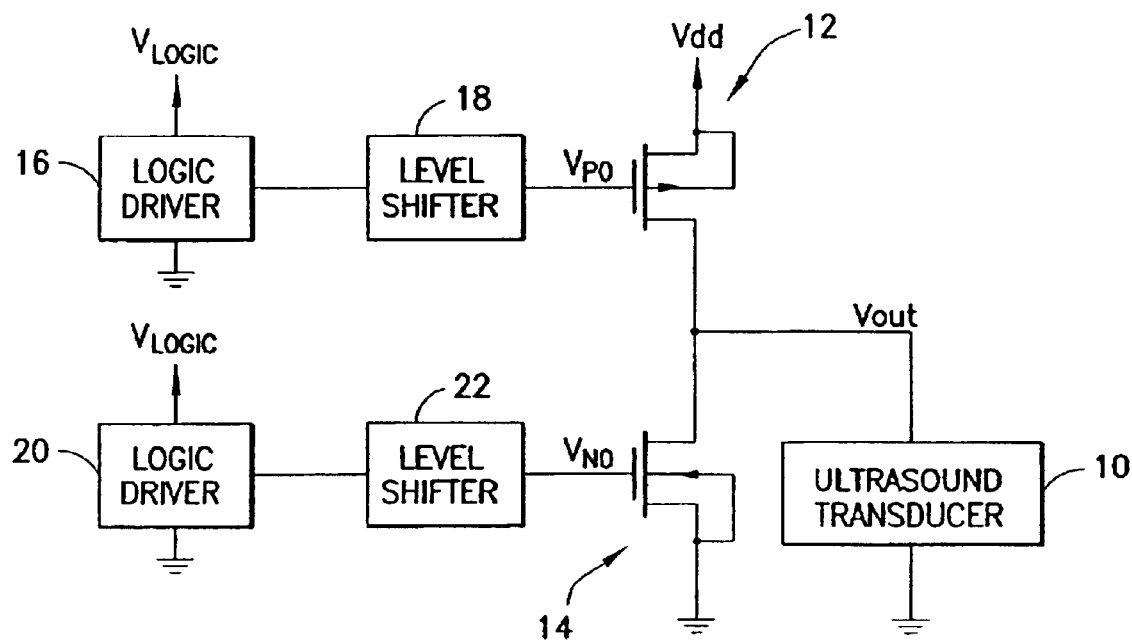
FIG. 6 is a schematic of a logic voltage-controlled rise-time ultrasound transmitter configuration.

In accordance with one embodiment of the invention shown in FIG. 6, the rise and/or fall times are trimmed by changing the control voltage off-chip. Referring to FIG. 6, the ultrasound transducer element 10 is driven by the voltage $V_{out}$ output from a junction connecting the drain of a PMOS transistor 12 to the drain of an NMOS transistor 14. The source of PMOS transistor 12 is connected to a terminal at potential $V_{dd}$, while the source of NMOS transistor 14 is connected to ground. The gate of PMOS transistor 12 has a control voltage $V_{P0}$ applied thereto by a level shifter 18, while the gate of NMOS transistor 14 has a control voltage $V_{N0}$ applied thereto by a level shifter 22.

A "level shifter" is a circuit that takes a pulse or control voltage of one value and translates it to a higher (or lower voltage). For example, one might have a TTL level pulse that begins at 0 V, pulses high to 3.3 V for a few microseconds and then drops back to 0 V. To control a PMOS device that is biased with its source up at 50 V with this TTL level pulse, some way of translating the 0V/3.3V/0V pulse up to a level of 50V/46.7V/50V is needed. This is typically done using an NMOS transistor that has a PMOS transistor as its load, which is diode-connected. One could also use a resistor in place of the PMOS transistor. When the NMOS transistor is turned on by the TTL level pulse, it pulls current through the PMOS transistor, which causes the voltage at the PMOS gate to drop from 50 V down to the desired control voltage (say down to 46.7 V). The output of the level shifter is the voltage at the PMOS gate, which is then fed to the other devices that need to be controlled.

In the embodiment shown in FIG. 6, the control voltage input to level shifter 18 is supplied by the logic (digital) driver 16, while the control voltage input to level shifter 21 is supplied by the logic (digital) driver 20. The digital drivers are typically inverters. The supply voltage to each "inverter" can be reduced independently, in which case the output of the inverter (i.e., the "control" voltage) will follow. The basic concept is to change the control voltages $V_{P0}$ and $V_{N0}$ supplied to the gates of the transistors 12 and 14 respectively. It is important to note that $V_{P0}$ can be changed independently of $V_{N0}$. This capability is important because $V_{P0}$ drives PMOS transistors and $V_{N0}$ drives NMOS transistors, and these devices change their characteristics differently with respect to semiconductor process variation. Therefore the rise and fall times can be adjusted independently.

Figure 7:
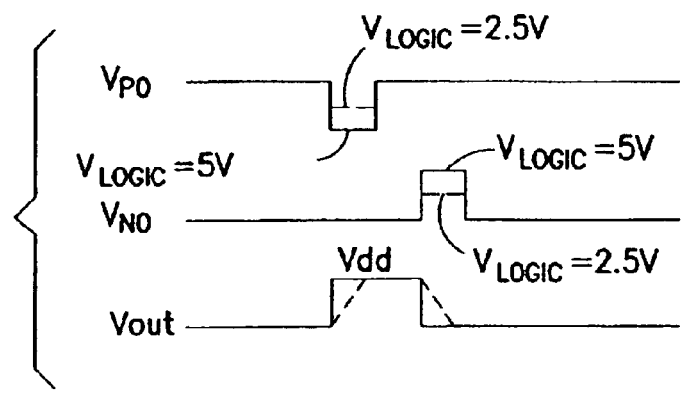
FIG. 7 is a graph showing the output voltage $V_{out}$ to the ultrasound transducer element and the corresponding input voltages $V_{P0}$ and $V_{N0}$ respectively supplied to the gates of a pair of output-stage transistors for the circuit depicted in FIG. 6. The dashed lines show variation of the rise/fall times of the output voltage $V_{out}$ as a function of variation in the logic voltage.

FIG. 7 is a graph showing the output voltage $V_{out}$ to the ultrasound transducer element and the corresponding input voltages $V_{P0}$ and $V_{N0}$ respectively supplied to the gates of output-stage transistors 12 and 14 of the circuit depicted in FIG. 6 for a given variation in the logic voltage. For the sake of illustration, FIG. 7 depicts the input and output voltages for the case wherein the gates of the output transistors 12 and 14 are respectively driven lower than the high-voltage supply $V_{dd}$ by a voltage $V_{LOGIC}$ and driven higher than ground by the same voltage $V_{LOGIC}$. The solid lines represent the case where $V_{LOGIC}$=5 V (which is analogous to the scenario depicted in FIG. 2) and the dashed lines represent the case where $V_{LOGIC}$=2.5 V (i.e., wherein the control voltage supplied to the gates of transistors 12 and 14 are adjusted). As can be seen in the graph of $V_{out}$ in FIG. 7, the foregoing decrease in the logic voltage causes a decrease in the rise and fall times, as indicated by dashed lines. By adjusting the logic voltage $V_{LOGIC}$ independently, semiconductor process variations can be compensated for. In particular, the logic voltages can be "tuned" to precisely the correct values for suppressing the second harmonic peak in the transmitted ultrasound beam. Tuning the logic voltage changes the slope of the pulse rising edge, which in turn enables a controlled minute change in the pulse duty cycle.

Figure 8:
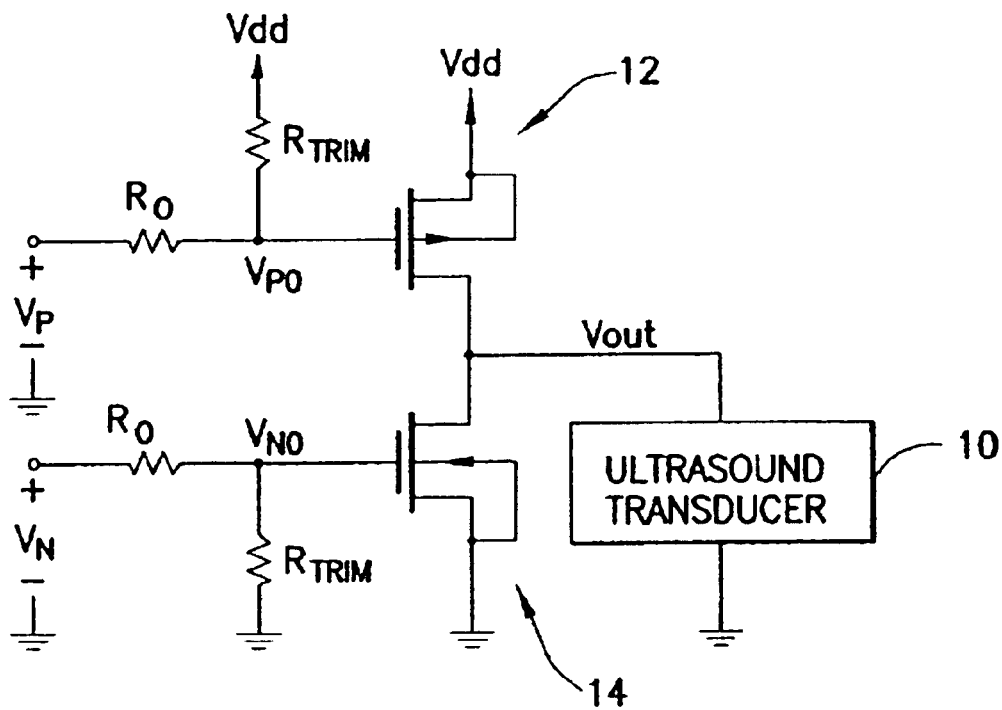
FIG. 8 is a schematic of a resistor-controlled rise-time ultrasound transmitter configuration.

In accordance with another embodiment of the invention shown in FIG. 8, the rise and/or fall times are trimmed by changing the control voltage by changing the control voltage on-chip using trimmed resistors. The resistors are trimmed during fabrication to the extent needed based on the results of calibration.

To allow for negative and positive adjustment of the rise and fall times, two methods can be used. The first method is "biased trimming". In this case the nominal value of the resistors (without trimming) is designed such that a nominal device without trimming will have a rise time that is greater than the desired value. To achieve nominal operation, these devices are trimmed down to the desired nominal vlaue. Devices that, as fabricated, would have fast rise times (disregarding the trim state) are trimmed even further such that they reach the desired nominal rise time. Those devices that would have slow rise times are not trimmed since the resistor network is biased to yield faster rise times without trimming.

The second method is "selected resistor trimming". In this case both resistors in the network between the drive signal and the MOSFET gate are trimmed. So referring to FIG. 8, to adjust the rise time to be faster, the resistor $R_0$ would be trimmed, whereas to adjust the rise time to be slower, the resistor $R_{TRIM}$ would be trimmed instead.

It is further understood that while trimming can be effected during manufacture using laser trimmed resistors or Zener taps, it can also be done using programming of nonvolatile control voltages and the use of controlled resistors such as MOSFETs or JFETs in place of $R_0$ and $R_{TRIM}$ in FIG. 8. Such trimming of controlled resistors can be done during system operation either periodically (e.g., on power up) or continuously to account for drift in rise time mismatch due to temperature variations. Finally, the resistor $R_0$ could also be replaced with a capacitor and both dynamically variable capacitors or MOSFET-switched capacitor networks could be used to effect trimming of the control voltages.

Figure 9:
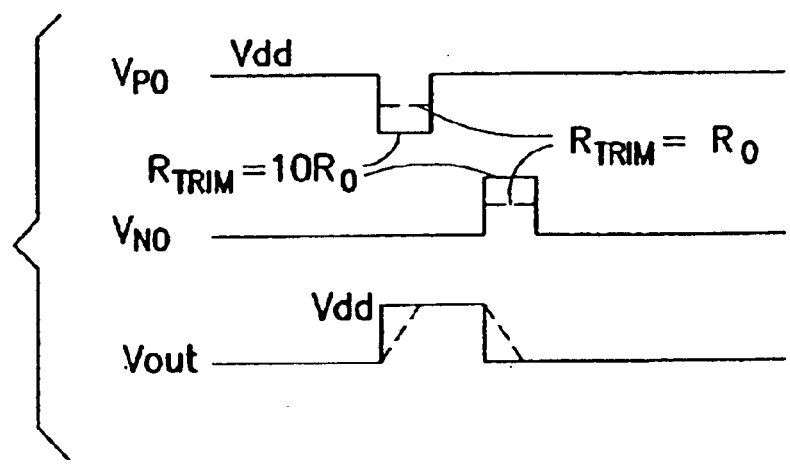
FIG. 9 is a graph showing the output voltage $V_{out}$ to the ultrasound transducer element and the corresponding input voltages $V_{P0}$ and $V_{N0}$ respectively supplied to the gates of a pair of output-stage transistors for the circuit depicted in FIG. 8. The dashed lines show variation of the rise/fall times of the output voltage $V_{out}$ as a function of variation in the trimmed resistance.

Referring to FIG. 8, the ultrasound transducer element 10 is driven by the voltage $V_{out}$ output from a junction connecting the drain of a PMOS transistor 12 to the drain of an NMOS transistor 14. The source of PMOS transistor 12 is connected to a terminal at a potential $V_{dd}$, while the source of NMOS transistor 14 is connected to ground. A resistance $R_0$ is placed between the gate of transistor 12 and the (+) terminal of the control signal voltage $V_P$; and a trim resistance $R_{TRIM}$ is placed between a terminal at the voltage $V_{dd}$ and a junction located between the resistance $R_0$ and the gate of transistor 12. Similarly, a resistance $R_0$ is placed between the gate of transistor 14 and the (+) terminal of the control signal voltage $V_N$; and a trim resistance $R_{TRIM}$ is placed between a terminal at ground potential and a junction located between the resistance $R_0$ and the gate of transistor 14. As previously mentioned, the respective trim resistances can be different, but for the example depicted in FIG. 9, the trim resistances $R_{TRIM}$ are equal. In accordance with this arrangement, when the control voltage $V_P$ is decreased, the drop in voltage $V_{P0}$ will be a function of the trim resistance $R_{TRIM}$. Likewise when the control voltage $V_N$ is increased, the rise in voltage $V_{N0}$ will be a function of the trim resistance $R_{TRIM}$. FIG. 9 shows two cases: (1) the case where $R_{TRIM} = 10R_0$ (indicated by solid lines); and (2) the case where $R_{TRIM} = R_0$ (indicated by dashed lines). As can be seen in the graph of $V_{out}$ in FIG. 9, the foregoing decrease in the trim resistance from $10R_0$ to $R_0$ causes a decrease in the rise and fall times, as indicated by dashed lines. Thus, the rise and fall times of the transmit pulses can be adjusted during fabrication by trimming the resistances $R_{TRIM}$ to the appropriate value or values, the latter being a function of the results of calibration of the ultrasound transmit integrated circuit.

A variation of the embodiment shown in FIG. 8 would use level shifters between the resistor network and the MOSFETs, with the resistors being biased at logic voltages instead of $V_{dd}$. This would allow for the use of low-voltage resistors. In semiconductor processes, high-voltage integrated resistors are much larger than low-voltage ones and are often unavailable.

Figure 10:
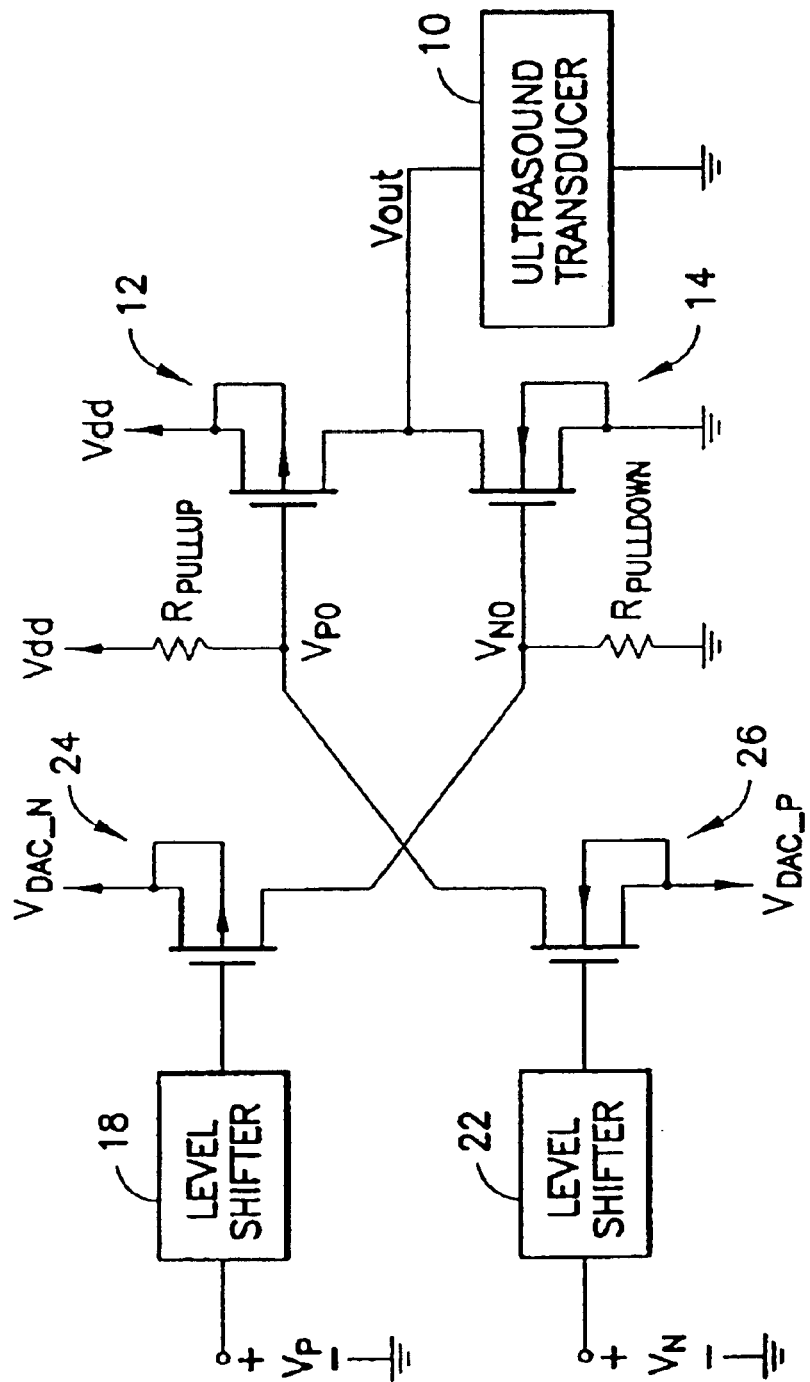
FIGS. 10 and 11 are schematics showing respective portions of a DAC-controlled rise-time ultrasound transmitter configuration.
Figure 11:
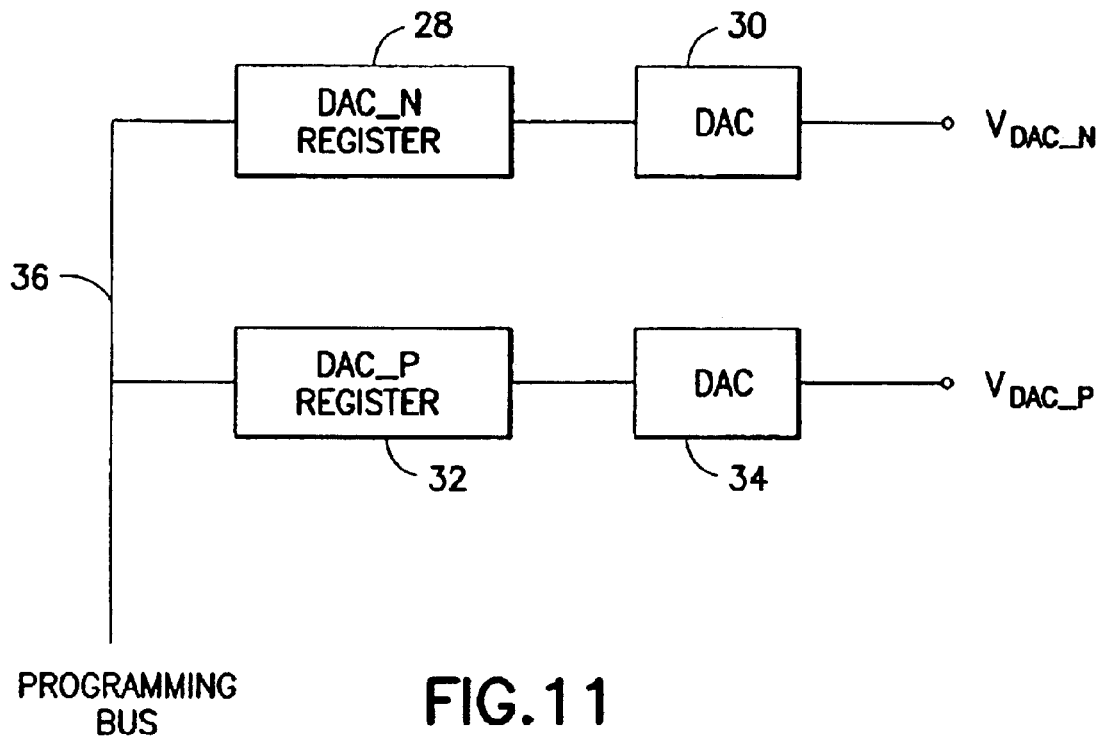

In accordance with yet another embodiment of the invention shown in FIGS. 10 and 11, the rise and/or fall times are trimmed by changing the control voltage on-chip by digital control using a digital-to-analog converter (DAC). Referring to FIG. 10, the ultrasound transducer element 10 is driven (as in the previous examples) by the voltage $V_{out}$ output from a junction connecting the drain of a PMOS transistor 12 to the drain of an NMOS transistor 14. The source of PMOS transistor 12 is connected to a terminal at potential $V_{dd}$, while the source of NMOS transistor 14 is connected to ground. The gate of PMOS transistor 12 is connected to the drain of an NMOS transistor 26, while the gate of NMOS transistor 14 is connected to the drain of a PMOS transistor 24. The control voltage at the gate of PMOS transistor 12 is designated $V_{P0}$, while the control voltage at the gate of NMOS transistor 14 is designated $V_{N0}$. A resistance $R_{pullup}$ is connected at one end to a junction between the gate of PMOS transistor 12 and the drain of NMOS transistor 26, and at the other end to a terminal at the potential $V_{dd}$. A resistance $R_{pulldown}$ is connected at one end to a junction between the gate of NMOS transistor 14 and the drain of PMOS transistor 24, and at the other end to ground. The gate of PMOS transistor 24 is in turn connected to the output of a level shifter 18, while the gate of NMOS transistor 26 is in turn connected to the output of a level shifter 22. Meanwhile the source of PMOS transistor 24 is connected to a potential $V_{DAC\_N}$, while the source of NMOS transistor 26 is connected to a potential $V_{DAC\_P}$. The input of the level shifter 18 is connected to the (+) terminal of a control signal voltage $V_N$, while the input of the level shifter 22 is connected to the (+) terminal of a control signal voltage $V_P$.

The potentials $V_{DAC\_N}$ and $V_{DAC\_P}$, to which the sources of transistors 24 and 26 are respectively connected, are independently programmable via the arrangement shown in FIG. 11, which arrangement forms part of the integrated circuit depicted in FIG. 10. A DAC 30 outputs the voltage level $V_{DAC\_N}$ in response to the input of a corresponding digital value from a DAC_N register 28, while a DAC 34 outputs the voltage level $V_{DAC\_P}$ in response to the input of a corresponding digital value from a DAC_P register 32. The digital values in registers DAC_N and DAC_P are inputted via a programming bus 36. It should be further understood that for a plurality of channels, it is possible to use a unique DAC for each channel on both the NMOS and PMOS devices for fine control of variation in the rise and fall times.

A variation of the embodiment shown in FIG. 11 would use level shifters between the DACs and the $V_{DAC\_N/P}$ voltages. While it is possible to construct high-voltage DACs, it would be cheaper to use low-voltage DACs and instead use level shifters to create the necessary high voltages.

Figure 12:
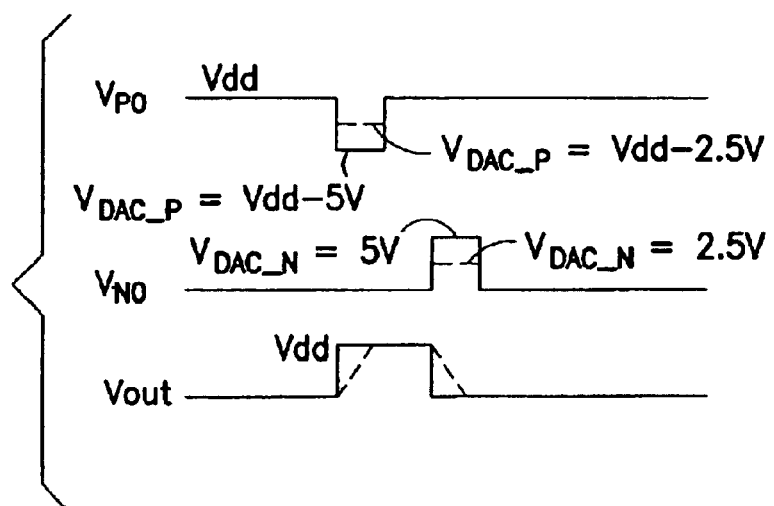
FIG. 12 is a graph showing the output voltage $V_{out}$ to the ultrasound transducer element and the corresponding input voltages $V_{P0}$ and $V_{N0}$ respectively supplied to the gates of a pair of output-stage transistors for the circuit depicted in FIGS. 10 and 11. The dashed lines show variation of the rise/fall times of the output voltage $V_{out}$ as a function of variation in the DAC

FIG. 12 is a graph showing the output voltage $V_{out}$ to the ultrasound transducer element and the corresponding input voltages $V_{P0}$ and $V_{N0}$ respectively supplied to the gates of output-stage transistors 12 and 14 of the circuit depicted in FIG. 10 for a given variation in the control voltage levels $V_{DAC\_N}$ and $V_{DAC\_P}$. For the sake of illustration, FIG. 12 depicts the input and output voltages for the case wherein $V_{DAC\_N} = V_{dd} - V_{DAC\_P} = 5$ V (solid lines) and for the case wherein $V_{DAC\_N} = V_{dd} - V_{DAC\_P} = 2.5$ V (dashed lines). For a given change in $V_P$, the gate control voltage $V_{P0}$ varies as a function of $V_{DAC\_P}$, thereby allowing the rise time of the pulse in $V_{out}$ to be selectively adjusted and controlled. Similarly, for a given change in $V_N$, the gate control voltage $V_{N0}$ varies as a function of $V_{DAC\_N}$, thereby allowing the fall time of the pulse in $V_{out}$ to be selectively adjusted and controlled. By decreasing $V_{DAC\_P}$, the rise time of the transmit pulse can be increased, while by increasing $V_{DAC\_N}$, the fall time of the transmit pulse can be increased. Again, this alternative arrangement makes it possible to compensate for semiconductor process variations can be compensated for.

In the disclosed embodiments, the output-stage transistors are preferably insulated-gate field-effect transistors (also known as MOSFETs).

In addition to embodiments wherein the output-stage transistors of the transmitter configuration are connected to an ultrasound transducer element directly, the invention is equally applicable to the situation wherein a transmit/receive switch is placed between the output-stage transistors and the transducer element. The transmit/receive switch is also connected to a low-voltage receive circuit. The transmit/receive switch has two states. In the transmit state, the transmit/receive switch connects the output-stage transistors to the ultrasound transducer element, while isolating the receive circuit from the high-voltage transmit pulse. In the receive state, the transmit/receive switch isolates the output-stage transistors from the ultrasound transducer element and instead connects the receive circuit.

Figure 13:
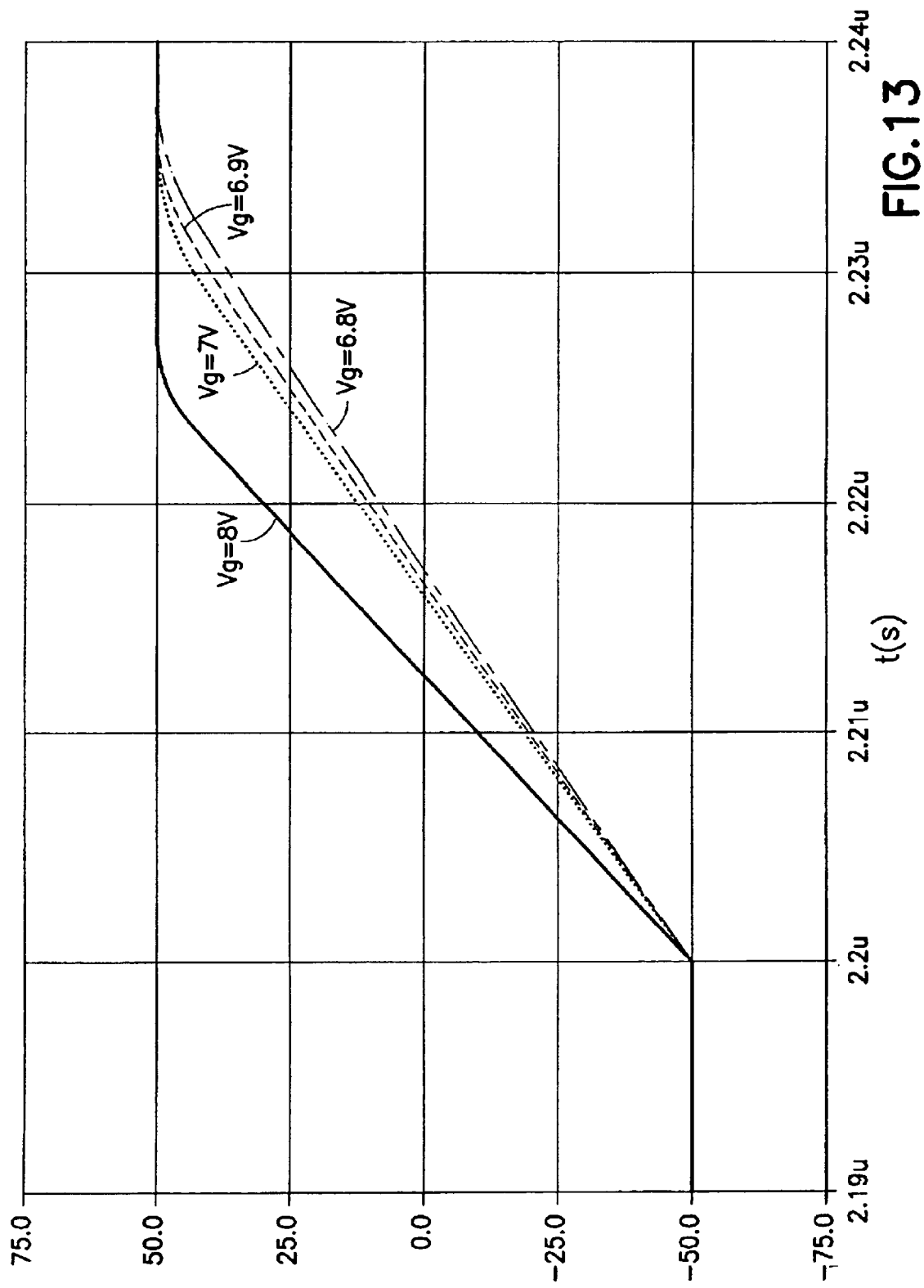
FIG. 13 is a graph showing the rise time as a function of the gate control voltage derived by computer simulation.

FIG. 13 shows a close-up of four pulse waveforms that are overlaid. These pulse waveforms were acquired by computer simulation. The difference between the four pulse waveforms is that the gate control voltage $V_g$ has been varied, the respective values being 6.8, 6.9, 7.0 and 8.0 V. This variation has changed the drive current, which in turn has changed the slope of the rising edge of the pulse. The change in the control voltage was done using what was essentially the DAC method. However, the simulation could alternatively be run using the resistor method.

Figure 14:
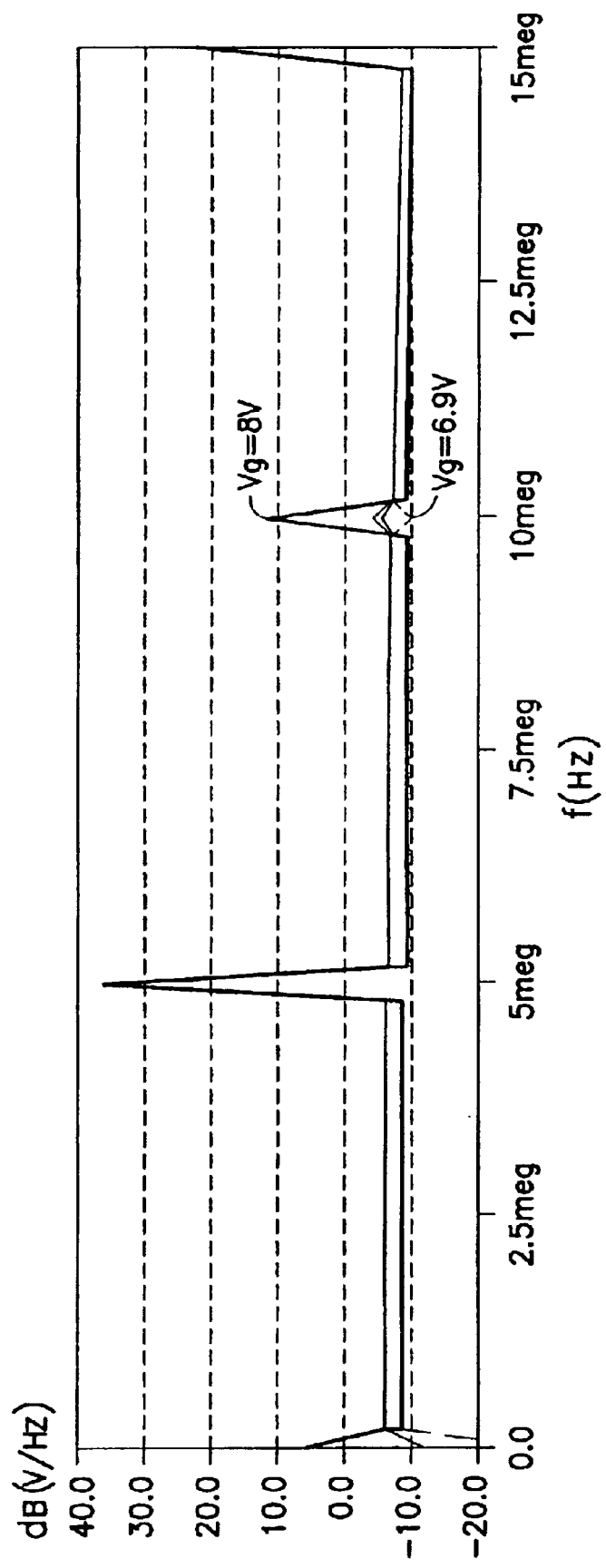
FIG. 14 is a graph showing the Fourier spectra for the pulses simulated in FIG. 13.

FIG. 14 shows the Fourier spectrum for the pulses in the plot in FIG. 13. As can be seen in FIG. 14, the second harmonic peak at 10 MHz is completely reduced when the control voltage is "tuned" to exactly the right value (in this case 6.9 V). The second harmonic must be as low as possible in ultrasound imaging because it leads to distortion and reduction in sensitivity.

Figure 15:
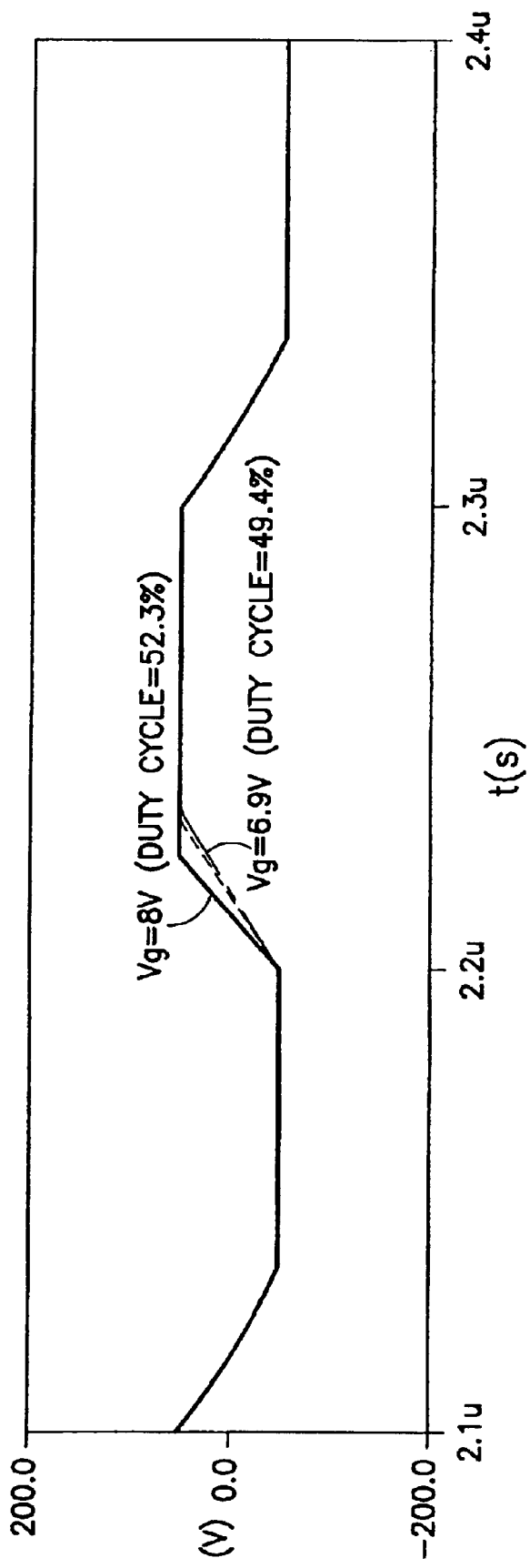
FIG. 15 is a graph showing the duty cycle for the pulses simulated in FIG. 13.

Tuning the gate control voltage changes the slope of the pulse rising edge, which in turn produces a controlled minute change in the pulse duty cycle, as is shown by the plot in FIG. 15. It is the duty cycle that contributes to second harmonic distortion in these pulses. Ideally it should be as close to 50% as possible. With mismatched transistors (due to process variation), this can be off by quite a bit. Thus, using this method in simulation, it was show that the second harmonic is effectively nulled when the gate control voltage is "tuned".

While the invention has been described with reference to preferred embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

What is claimed is:

1. A device comprising an ultrasound transducer element and an integrated circuit, said integrated circuit comprising means for driving said ultrasound transducer element with a transmit pulse having a rise time and a fall time; and means for varying the rise or fall time of said transmit pulse, wherein said driving means comprise a first PMOS transistor and a first NMOS transistor having their drains connected at a junction, the source of said first PMOS transistor being connected to a terminal at a first voltage level and the source of said first NMOS transistor being connected to ground, said junction being electrically coupled to an input of said ultrasound transducer element, and said time varying means comprise a second NMOS transistor having a drain connected to the gate of said first PMOS transistor and having a source connected to a terminal at a first control voltage level, and a first digital-to-analog converter that supplies said first control voltage level.

2. The device as recited in claim 1, further comprising a first level shifter having an output connected to a gate of said second NMOS transistor and an input connected to a control signal voltage.

3. An ultrasound transducer comprising a plurality of devices as recited in claim 1, said ultrasound transducer elements being arranged to form an array.

4. A device comprising an ultrasound transducer element and an integrated circuit, said integrated circuit comprising means for driving said ultrasound transducer element with a transmit pulse having a rise time and a fall time; and means for varying the rise and fall time of said transmit pulse, wherein said driving means comprise a first PMOS transistor and a first NMOS transistor having their drains connected at a junction, the source of said first PMOS transistor being connected to a terminal at a first voltage level and the source of said first NMOS transistor being connected to ground, said junction being electrically coupled to an input of said ultrasound transducer element, and said time varying means comprise a second NMOS transistor having a drain connected to the gate of said first PMOS transistor and having a source connected to a terminal at a first control voltage level, a first digital-to-analog converter that supplies said first control voltage level; a second PMOS transistor having a drain connected to the gate of said first NMOS transistor and having a source connected to a terminal at a second control voltage level; and a second digital-to-analog converter that supplies said second control voltage level.

5. The device as recited in claim 4, wherein said time varying means further comprises a first programmable register connected to said first digital-to-analog converter, and a second programmable register connected to said second digital-to-analog converter.

6. The device as recited in claim 4, wherein said first and second control voltage levels are different.

7. The device as recited in claim 4, further comprising a first level shifter having an output connected to a gate of said second NMOS transistor and an input connected to a first control signal voltage, and a second level shifter having an output connected to a gate of said second PMOS transistor and an input connected to a second control signal voltage.

8. A method for adjusting the duty cycle of an ultrasound transmit pulse output by an integrated circuit to an ultrasound transducer element, comprising the following steps:

calibrating the rise times of ultrasound transmit pulses output by said integrated circuit as a function of a variable first logic voltage;

determining a second voltage that produces a desired rise time; and driving said integrated circuit with said second logic voltage to produce a transmit pulse having said desired rise time.

9. The method as recited in claim 8, further comprising the following steps:

calibrating the fall times of said ultrasound transmit pulses output by said integrated circuit as a function of a variable third logic voltage;

determining a fourth voltage that produces a desired fall time; and driving said integrated circuit with said fourth logic voltage that causes said transmit pulse to fall with said desired fall time.

10. A device comprising:

an ultrasound transducer element;

a first PMOS transistor and a first NMOS transistor having their drains connected at a junction, the source of said first PMOS transducer being connected to a first terminal at a first voltage level and the source of said first NMOS transistor being connected to a second terminal at a second voltage level less than said first voltage level, said junction being electrically coupled to an input of said ultrasound transducer element;

a second NMOS transistor having a drain connected to the gate of said first PMOS transistor and having a source connected to a third terminal at a first control voltage level; and a first digital-to-analog converter that supplies said first control voltage level.

11. The device as recited in claim 10, further comprising a first level shifter having an output connected to a gate of said second NMOS transistor and an input connected to a control signal voltage.

12. The device as recited in claim 10, further comprising a second PMOS transistor having a drain connected to the gate of said first NMOS transistor and having a source connected to a fourth terminal at a second control voltage level, and a second digital-to-analog converter that supplies said second control voltage level.

13. The device as recited in claim 12, further comprising a first programmable register connected to said first digital-to-analog converter, and a second programmable register connected to said second digital-to-analog converter.

14. The device as recited in claim 12, wherein said first and second control voltage levels are different.

15. The device as recited in claim 13, wherein said transistors, said digital-to-analog converters and said programmable registers form parts of an integrated circuit.

* * * * *